US009105331B2

(12) United States Patent
Rho

(10) Patent No.: US 9,105,331 B2
(45) Date of Patent: Aug. 11, 2015

(54) SEMICONDUCTOR MEMORY APPARATUS AND METHOD OF OPERATING USING THE SAME

(71) Applicant: SK hyinx Inc, Icheon-si, Gyeonggi-do (KR)

(72) Inventor: Kwang Myoung Rho, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 205 days.

(21) Appl. No.: 13/845,288

(22) Filed: Mar. 18, 2013

(65) Prior Publication Data

US 2014/0003129 A1    Jan. 2, 2014

(30) Foreign Application Priority Data

Jun. 28, 2012    (KR) .......................... 10-2012-0070008

(51) Int. Cl.
*G11C 7/12*    (2006.01)
*G11C 13/00*    (2006.01)
*G11C 7/08*    (2006.01)
*G11C 7/06*    (2006.01)

(52) U.S. Cl.
CPC ............... *G11C 13/004* (2013.01); *G11C 7/08* (2013.01); *G11C 13/0069* (2013.01); *G11C 7/065* (2013.01); *G11C 2013/0042* (2013.01); *G11C 2013/0045* (2013.01); *G11C 2013/0054* (2013.01)

(58) Field of Classification Search
CPC .................... G11C 2013/0042; G11C 13/0026
USPC .......................................................... 365/148
See application file for complete search history.

(56) References Cited

U.S. PATENT DOCUMENTS

2006/0239097 A1*  10/2006  Nakai et al. .................... 365/222
2010/0091549 A1*   4/2010  Lee et al. ....................... 365/148

FOREIGN PATENT DOCUMENTS

KR    1020090031128 A    3/2009
KR    1020110072452 A    6/2011

* cited by examiner

*Primary Examiner* — Huan Hoang
*Assistant Examiner* — Jay Radke
(74) *Attorney, Agent, or Firm* — William Park & Associates Ltd.

(57) ABSTRACT

A semiconductor memory apparatus includes a resistive memory cell coupled between a bit line and a bit line bar; a control unit configured to couple the bit line to a first node and apply a reference voltage to a second node in response to a first sense amplifier enable signal and a second sense amplifier enable signal; a data output sense amplifier configured to sense and amplify a voltage of the first node and a voltage of the second node; a data transfer unit configured to couple the first and second nodes to a data line and a data line bar in response to a column select signal; and a data input unit configured to drive the bit line and the bit line bar according to voltage levels of the first and second nodes in response to a write enable signal.

19 Claims, 4 Drawing Sheets

SEMICONDUCTOR MEMORY APPARATUS AND METHOD OF OPERATING USING THE SAME

CROSS-REFERENCES TO RELATED APPLICATION

The present application claims priority under 35 U.S.C. §119(a) to Korean application number 10-2012-0070008, filed on Jun. 28, 2012, in the Korean Intellectual Property Office, which is incorporated herein by reference in its entirety.

BACKGROUND

1. Technical Field

Various embodiments relate to a semiconductor integrated circuit, and more particularly, to a semiconductor memory apparatus.

2. Related Art

In general, a semiconductor memory apparatus as a volatile memory device includes a memory cell which is constituted by a capacitor. Since the semiconductor memory apparatus includes the memory cell constituted by the capacitor, loss of charges charged in the capacitor is caused, and due to this fact, the semiconductor memory apparatus is called a volatile memory device.

Referring to FIG. 1, a conventional semiconductor memory apparatus includes a memory cell 10, a first equalizer unit 20, a bit line disconnection unit 30, a second equalizer unit 40, a sense amplifier 50, and a data transfer unit 60.

The memory cell 10 is coupled to a bit line BL when a word line WL is enabled. The memory cell 10 includes a first transistor N1 and a capacitor C1. The first transistor N1 has a gate to which the word line WL is coupled and a drain and a source to which the bit line BL and one end of the capacitor C1 are coupled. The capacitor C1 has one end to which the first transistor N1 is coupled and the other end which is applied with a cell plate voltage VCP.

The first equalizer unit 20 couples the bit line BL and a bit line bar BLb with each other when a bit line equalizer signal BLEQ is enabled.

The first equalizer unit 20 includes a second transistor N2. The second transistor N2 has a gate which is inputted with the bit line equalizer signal BLEQ and a drain and a source to which the bit line BL and the bit line bar BLb are coupled.

The bit line disconnection unit 30 decouples the bit line BL and the bit line bar BLb from the sense amplifier 50 when a bit line isolation signal BIS is enabled. Also, the bit line disconnection unit 30 couples the bit line BL and the bit line bar BLb with the sense amplifier 50 when the bit line isolation signal BIS is disabled.

The bit line disconnection unit 30 includes third and fourth transistors N3 and N4. The third transistor N3 has a gate which is inputted with the bit line isolation signal BIS and a drain and a source to which the bit line BL and the sense amplifier 50 are coupled. The fourth transistor N4 has a gate which is inputted with the bit line isolation signal BIS, and a drain and a source to which the bit line bar BLb and the sense amplifier 50 are coupled.

The second equalizer unit 40 couples a node to which the bit line BL and the sense amplifier 50 are coupled and a node to which the bit line bar BLb and the sense amplifier 50 are coupled, when the bit line equalizer signal BLEQ is enabled, and applies a bit line precharge voltage VBLP to both nodes.

The second equalizer unit 40 includes fifth and sixth transistors N5 and N6. The fifth transistor N5 has a gate which is inputted with the bit line equalizer signal BLEQ and a drain and a source to which the node coupled to the bit line BL and the sense amplifier 50 and the sixth transistor N6 are coupled. The sixth transistor N6 has a gate which is inputted with the bit line equalizer signal BLEQ and a drain and a source to which the node coupled to the bit line bar BLb and the sense amplifier 50 and the fifth transistor N5 are coupled. The bit line precharge voltage VBLP is applied to a node to which the fifth and sixth transistors N5 and N6 are coupled.

The sense amplifier 50 senses and amplifies the voltage difference between the bit line BL and the bit line bar BLb.

The sense amplifier 50 includes seventh to tenth transistors P1, P2, N7 and N8. The seventh transistor P1 has a source which is applied with a first driving voltage RTO and a gate to which the bit line bar BLb is coupled. The eighth transistor P2 has a source which is applied with the first driving voltage RTO and a gate to which the bit line BL is coupled. The ninth transistor N7 has a gate to which the bit line bar BLb is coupled, a drain to which the drain of the seventh transistor P1 is coupled, and a source which is applied with a second driving voltage SB. The tenth transistor N8 has a gate to which the bit line BL is coupled, a drain to which the drain of the eight transistor P2 is coupled, and a source which is applied with the second driving voltage SB. The bit line BL is coupled to a node to which the seventh and the ninth transistors P1 and N7 are coupled, and the bit line bar BLb is coupled to a node to which the eighth and tenth transistors P2 and N8 are coupled. The first and second driving voltages RTO and SB as voltages for activating the sense amplifier 50 are voltages which are applied to the sense amplifier 50 when a sense amplifier enable signal (SAE) is enabled. For, example, a sense amplifier driving unit (70) generates the first and second driving voltages RTO and SB when the sense amplifier enable signal (SAE) is enabled.

The data transfer unit 60 transfers the voltage amplified in the sense amplifier 50, to a data line DATA_L and a data line bar DATA_Lb when a column select signal YI is enabled.

The data transfer unit 60 includes eleventh and twelfth transistors N9 and N10. The eleventh transistor N9 has a gate which is inputted with the column select signal YI and a drain and a source to which a node coupled with the bit line BL and the sense amplifier 50 and the data line DATA_L are coupled. The twelfth transistor N10 has a gate which is inputted with the column select signal YI and a drain and a source to which a node coupled with the bit line bar BLb and the sense amplifier 50 and the data line bar DATA_Lb are coupled.

The conventional semiconductor memory apparatus configured as described above operates as follows.

As the word line WL is enabled, the memory cell 10 and the bit line BL are coupled. As the charges of the capacitor C1 of the memory cell 10 are transferred to the bit line BL, a voltage difference occurs between the bit line BL and the bit line bar BLb.

The bit line disconnection unit 30 couples the bit line BL and the bit line bar BLb to the sense amplifier 50 when the bit line isolation signal BIS is disabled.

The sense amplifier 50 senses and amplifies the voltage difference between the bit line BL and the bit line bar BLb.

The data transfer unit 60 transfers the voltage amplified by the sense amplifier 50, to the data line DATA_L and the data line bar DATA_Lb when the column select signal YI is enabled.

In this way, the semiconductor memory apparatus which stores data using the capacitor C1 is configured to sense and amplify the voltage difference between the bit line BL and the bit line bar BLb, resulting from the charge amount of the capacitor C1, and output the amplified voltage to an outside of the semiconductor memory apparatus.

The semiconductor memory apparatus including the memory cell constituted by the capacitor is utilized as a volatile memory in a number of industrial fields as described above.

Research has continuously been made to allow a semiconductor memory apparatus including a memory cell constituted by a resistive device to replace the semiconductor memory apparatus including the memory cell constituted by the capacitor and to be used in an industrial field.

SUMMARY

A nonvolatile semiconductor memory apparatus which can operate in the same circumstances (interface) as a semiconductor memory apparatus including a memory cell constituted by a capacitor is described herein.

In an embodiment of the present invention, a semiconductor memory apparatus includes: a resistive memory cell coupled between a bit line and a bit line bar; a control unit configured to couple the bit line to a first node in response to a first sense amplifier enable signal and a second sense amplifier enable signal, and apply a reference voltage to a second node in response to the second sense amplifier enable signal; a data output sense amplifier configured to sense and amplify a voltage of the first node and a voltage of the second node; a data transfer unit configured to couple the first and second nodes to a data line and a data line bar in response to a column select signal; and a data input unit configured to drive the bit line and the bit line bar according to voltage levels of the first and second nodes in response to a write enable signal.

In an embodiment of the present invention, a semiconductor memory apparatus includes: a control unit configured to couple a bit line and a data output sense amplifier in a read operation; the data output sense amplifier configured to sense and amplify a voltage level of the bit line when the data output sense amplifier is coupled to the bit line; a data transfer unit configured to couple a data line to the data output sense amplifier and a data input unit in a read or write operation; and the data input unit configured to drive a voltage level of the data line when the data input unit is coupled to the data line and transfer the voltage level of the data line to the bit line.

In an embodiment of the present invention, a semiconductor memory apparatus includes: a resistive memory cell coupled between a bit line and a bit line bar; a control unit configured to couple the bit line and a data output sense amplifier and couple the bit line bar and a ground terminal in response to a sense amplifier enable signal; the data output sense amplifier configured to compare a voltage level of the bit line with a level of a reference voltage and amplify a difference thereof, when the data output sense amplifier is coupled to the bit line; a data input unit configured to generate voltage levels of the bit line and the bit line bar according to voltage levels of a data line and a data line bar in response to a write enable signal, when the data input unit is coupled to the data line and the data line bar; and a data transfer unit configured to couple or decouple the data line to and from the data output sense amplifier and the data input unit in response to a column select signal.

In an embodiment of the present invention, a method of operating a semiconductor memory apparatus includes: coupling a resistive memory cell between a bit line and a bit line bar; coupling the bit line to a first node and applying a reference voltage to a second node in response to a first sense amplifier enable signal and a second sense amplifier enable signal; sensing and amplifying a voltage of the first node and a voltage of the second node; coupling the first and second nodes to a data line and a data line bar in response to a column select signal; and driving the bit line and the bit line bar according to voltage level of the first and second nodes in response to a write enable signal.

BRIEF DESCRIPTION OF THE DRAWINGS

Features, aspects, and embodiments are described in conjunction with the attached drawings, in which.

DETAILED DESCRIPTION

Hereinafter, a semiconductor memory apparatus according to the present invention will be described below with reference to the accompanying drawings through various embodiments.

Figure 2:
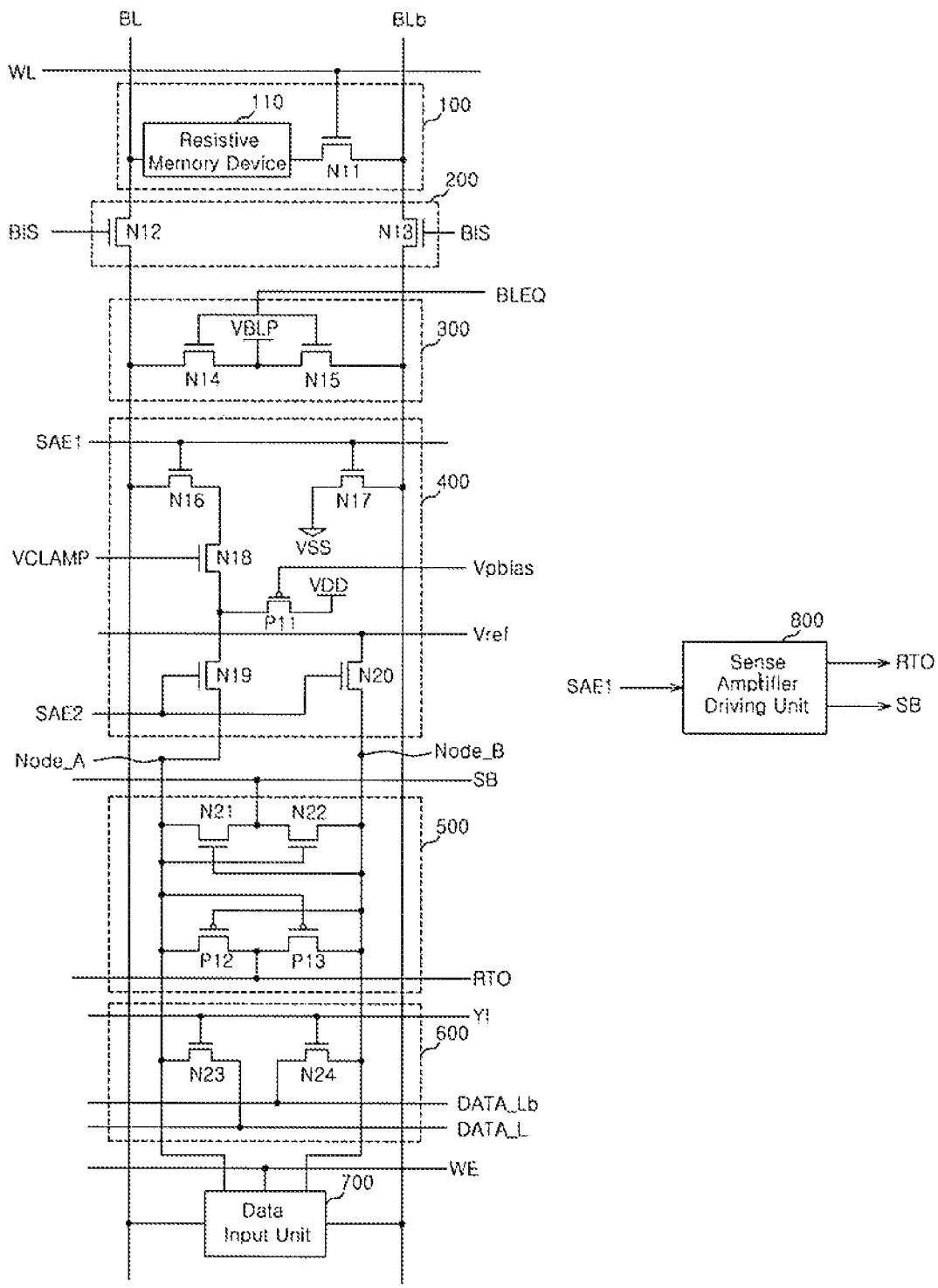
FIG. 2 is a configuration diagram of a semiconductor memory apparatus in accordance with an embodiment of the present invention.

Referring to FIG. 2, a semiconductor memory apparatus in accordance with an embodiment of the present invention may include a resistive memory cell 100, a bit line disconnection unit 200, an equalizer unit 300, a control unit 400, a data output sense amplifier 500, a data transfer unit 600, and a data input unit 700.

The resistive memory cell 100 may include a resistive memory device 110 of which resistance value changes according to a value of stored data, and a first transistor N11. The resistive memory device 110 has one end which may be coupled to a bit line BL and the other end which may be coupled to the first transistor N11. The first transistor N11 has a gate to which a word line WL may be coupled and a drain and a source to which the other end of the resistive memory device 110 and a bit line bar BLb are respectively coupled.

The bit line disconnection unit 200 may be configured to couple and decouple the bit line BL and the bit line bar BLb to and from the control unit 400 in response to a bit line isolation signal BIS. For example, the bit line disconnection unit 200 decouples the bit line BL and the bit line bar BLb from the control unit 400 when the bit line isolation signal BIS is enabled, and couples the bit line BL and the bit line bar BLb to the control unit 400 when the bit line isolation signal BIS is disabled.

The bit line disconnection unit 200 may include second and third transistors N12 and N13. The second transistor N12 has a gate which is inputted with the bit line isolation signal BIS, a drain to which the bit line BL may be coupled and a source to which the control unit 400 may be coupled. The third transistor N13 has a gate which is inputted with the bit line isolation signal BIS, a drain to which the bit line bar BLb may be coupled and a source to which the control unit 400 may be coupled.

The equalizer unit 300 may be configured to make the voltage levels of the bit line BL and the bit line bar BLb the same in response to a bit line equalizer signal BLEQ. For instance, the equalizer unit 300 applies a bit line precharge voltage VBLP to the bit line BL and the bit line bar BLb when the bit line equalizer signal BLEQ is enabled.

The equalizer unit 300 may include fourth and fifth transistors N14 and N15. The fourth transistor N14 has a gate which is inputted with the bit line equalizer signal BLEQ, a source to which the bit line BL may be coupled, and a drain to which the drain of the fifth transistor N15 may be coupled. The fifth transistor N15 has a gate which is inputted with the bit line equalizer signal BLEQ, a source to which the bit line bar BLb may be coupled, and a drain to which the drain of the fourth transistor N14 may be coupled. The bit line precharge voltage VBLP is applied to a node to which the fourth transistor N14 and the fifth transistor N15 are coupled.

The control unit 400 may be configured to couple the bit line BL to a first node Node A in response to a first sense amplifier enable signal (SAE1) and a second sense amplifier enable signal (SAE2), couple the bit line bar BLb to a ground terminal VSS in response to the first sense amplifier enable signal (SAE1) and apply a reference voltage Vref to a second node Node_B in response to the second sense amplifier enable signal (SAE2), The second sense amplifier enable signal SAE2 is a signal which is acquired by delaying a sense amplifier enable signal SAE1, and in order to distinguish the sense amplifier enable signal SAE1 from the second sense amplifier enable signal SAE2, the sense amplifier enable signal SAE1 is referred to as the first sense amplifier enable signal SAE1. The control unit 400 applies a power supply voltage VDD to the bit line BL when the first sense amplifier enable signal SAE1 is enabled. Therefore, if the first sense amplifier enable signal SAE1 is enabled in the state in which the word line WL is enabled, a current path which flows through the bit line BL, the resistive memory cell 100 and the bit line bar BLb is formed. If the second sense amplifier enable signal SAE2 is enabled, the bit line BL may be coupled to the first node Node_A, and the reference voltage Vref is applied to the second node Node_B.

The control unit 400 may include sixth to eleventh transistors N16 to N20 and P11. The sixth transistor N16 has a gate which is inputted with the first sense amplifier enable signal SAE1 and a source to which the bit line BL may be coupled. The seventh transistor N17 has a gate which is inputted with the first sense amplifier enable signal SAE1, a drain to which the bit line bar BLb may be coupled, and a source to which the ground terminal VSS may be coupled. The eighth transistor N18 has a gate which is applied with a clamp voltage VCLAMP and a source to which the drain of the sixth transistor N16 may be coupled. The ninth transistor N19 has a drain and a source to which the drain of the eighth transistor N18 and the first node Node_A are respectively coupled and a gate to which the second sense amplifier enable signal SAE2 is inputted. The tenth transistor N20 has a gate to which the second sense amplifier enable signal SAE2 is inputted, a drain which is applied with the reference voltage Vref, and a source to which the second node Node_B may be coupled. The eleventh transistor P11 has a gate which is applied with a bias voltage Vpbias, a source to which the power supply voltage VDD is applied, and a drain to which a node coupled with the eighth and ninth transistors N18 and N19 may be coupled.

The data output sense amplifier 500 may be configured to sense and amplify the voltage level of the first node Node_A and the voltage level of the second node Node_B. For example, the data output sense amplifier 500 senses and amplifies the voltage level of the bit line BL which may be coupled through the first node Node_A and the level of the reference voltage Vref which is applied through the second node Node_B.

The data output sense amplifier 500 may include twelfth to fifteenth transistors N21, N22, P12 and P13. The twelfth transistor N21 has a gate to which the second node Node_B may be coupled and a drain and a source to which the first node Node_A and the thirteenth transistor N22 are respectively coupled. The thirteenth transistor N22 has a gate to which the first node Node_A may be coupled and a drain and a source to which the twelfth transistor N21 and the second node Node_B are respectively coupled. The fourteenth transistor P12 has a gate to which the second node Node_B may be coupled and a drain and a source to which the first node Node_A and the fifteenth transistor P13 are respectively coupled. The fifteenth transistor P13 has a gate to which the first node Node_A may be coupled and a drain and a source to which the fourteenth transistor P12 and the second node Node_B are respectively coupled. A first driving voltage RTO is applied to a node to which the fourteenth and fifteenth transistors P12 and P13 are coupled, and a second driving voltage SB is applied to a node to which the twelfth transistor N21 and the thirteenth transistor N22 are coupled. The first and second voltages RTO and SB as the operating voltages of the data output sense amplifier 500 are applied to the data output sense amplifier 500. For example, a sense amplifier driving unit (800) generates the first and second driving voltage RTO and SB when the first sense amplifier enable signal (SAE1) is enabled.

The data transfer unit 600 may be configured to couple the first and second nodes Node_A and Node_B to a data line DATA_L and a data line bar DATA_Lb in response to a column select signal YI. For instance, the data transfer unit 600 couples the first node Node_A to the data line DATA_L and couples the second node Node_B to the data line bar DATA_Lb when the column select signal YI is enabled.

The data transfer unit 600 may include sixteenth and seventeenth transistors N23 and N24. The sixteenth transistor N23 has a gate which is inputted with the column select signal YI and a drain and a source to which the first node Node_A and the data line DATA_L are respectively coupled. The seventeenth transistor N24 has a gate which is inputted with the column select signal YI and a drain and a source to which the second node Node_B and the data line bar DATA_Lb are respectively coupled.

The data input unit 700 may be configured to drive the bit line BL and the bit line bar BLb according to the voltage levels of the first and second nodes Node_A and Node_B in response to a write enable signal WE. For example, the data input unit 700 lowers the voltage level of the bit line BL and raises the voltage level of the bit line bar BLb when the voltage level of the first node Node_A is higher than the voltage level of the second node Node_B in the case where the write enable signal WE is enabled. Further, the data input unit 700 raises the voltage level of the bit line BL and lowers the voltage level of the bit line bar BLb when the voltage level of the first node Node_A is lower than the voltage level of the second node Node_B in the case where the write enable signal WE is enabled. The write enable signal WE may be enabled in a write operation and may be a signal which is enabled in a mode for inputting data again to the resistive memory device 110.

Figure 3:
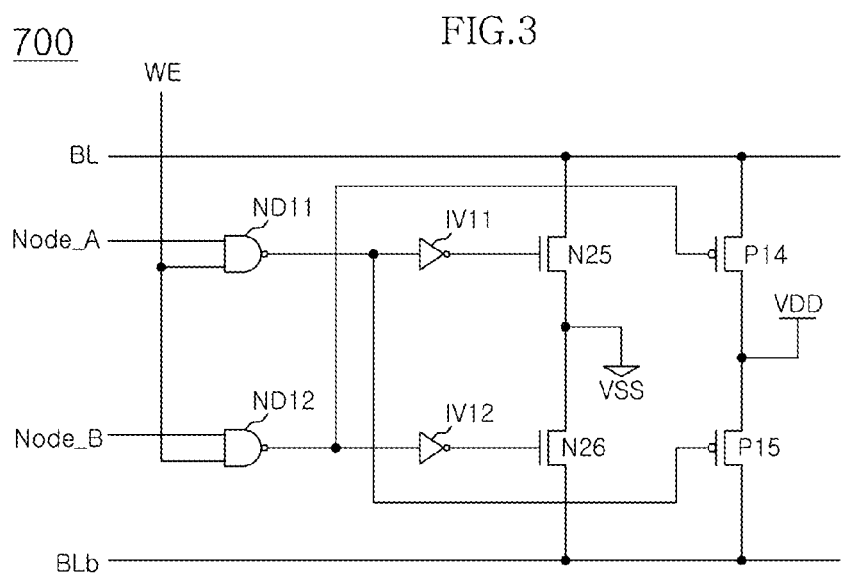
FIG. 3 is a configuration diagram of the data input unit of FIG. 2.

Referring to FIG. 3, the data input unit 700 may include first and second NAND gates ND11 and ND12, first and second inverters IV11 and IV12, and eighteenth to twenty first transistors N25, N26, P14 and P15. The first NAND gate ND11 is inputted with the voltage level of the first node Node_A and is inputted with the write enable signal WE. The second NAND gate ND12 is inputted with the voltage level of the second node Node_B and is inputted with the write enable signal WE. The first inverter IV11 is inputted with the output signal of the first NAND gate ND11. The second inverter IV12 is inputted with the output signal of the second NAND gate ND12. The eighteenth transistor N25 has a gate which is inputted with the output signal of the first inverter IV11, a drain to which the bit line BL may be coupled, and a source to which the ground terminal VSS may be coupled. The nineteenth transistor N26 has a gate which is inputted with the output signal of the second inverter IV12, a drain to which the bit line bar BLb may be coupled, and a source to which the ground terminal VSS may be coupled. The twentieth transistor P14 has a gate which is inputted with the output signal of the second NAND gate ND12, a drain to which the bit line BL may be coupled, and a source which is applied with the power supply voltage VDD. The twenty first transistor P15 has a gate which is inputted with the output signal of the first NAND gate ND11, a drain to which the bit line bar BLb may be coupled, and a source which is applied with the power supply voltage VDD.

Figure 4:
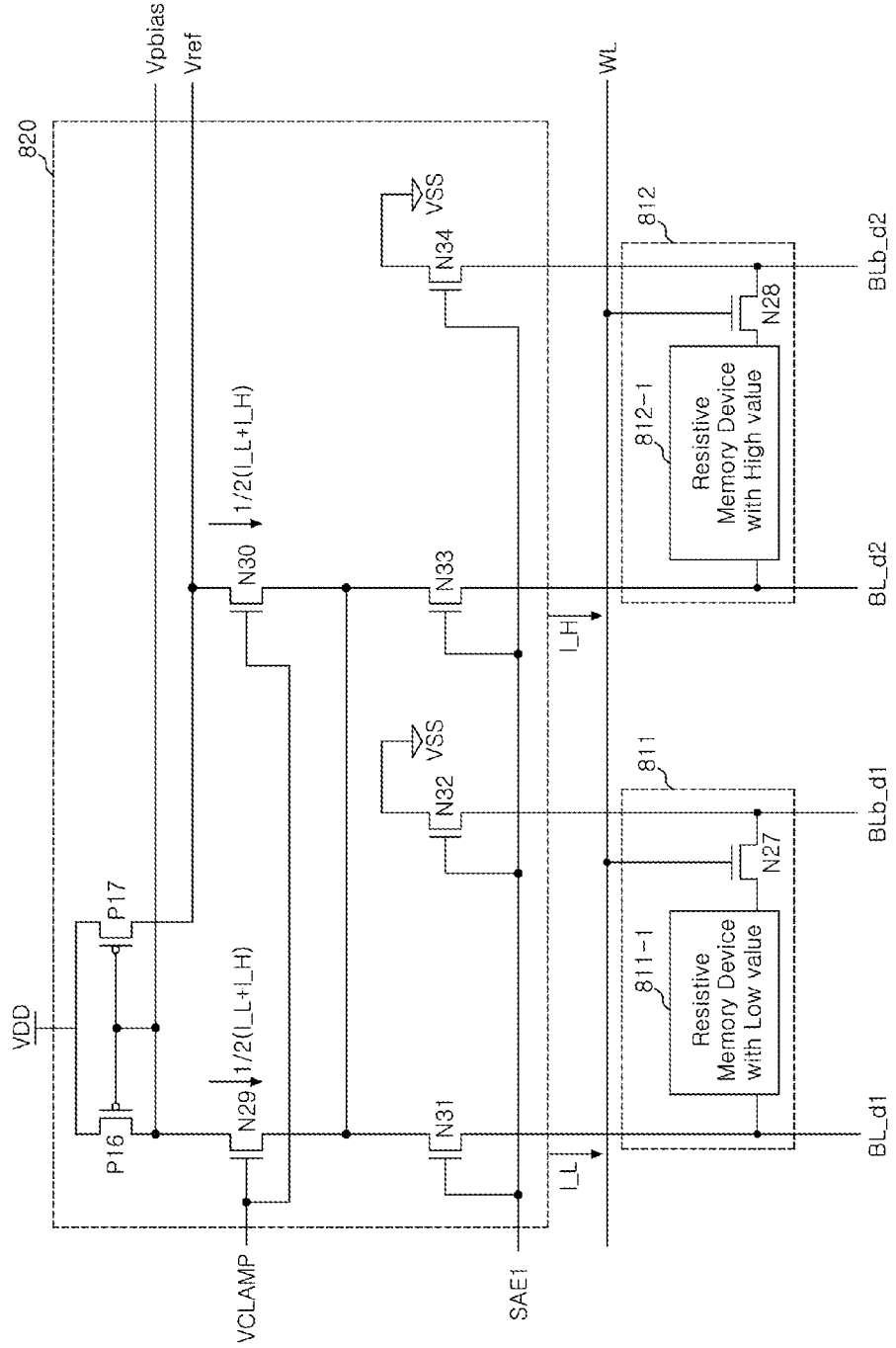
FIG. 4 is a configuration diagram of the reference voltage is generation unit of the semiconductor memory apparatus in accordance with the embodiments of the present invention.

Referring to FIG. 4, the semiconductor memory apparatus in accordance with the embodiments of the present invention may further include first and second dummy resistive memory cells 811 and 812 and a reference voltage generation unit 820.

The first dummy resistive memory cell 811 has a data value of a low level.

The first dummy resistive memory cell 811 has a resistive memory device with a low value 811-1 and a twenty second transistor N27. The resistive memory device with a low value 811-1 has one end to which a first dummy bit line BL_d1 may be coupled. The twenty second transistor N27 has a gate to which the word line WL may be coupled, and a drain and a source to which the other end of the resistive memory device with a low value 811-1 and a first dummy bit line bar BLb_d1 are respectively coupled.

The second dummy resistive memory cell 812 has a data value of a high level.

The second dummy resistive memory cell 812 has a resistive memory device with a high value 812-1 and a twenty third transistor N28. The resistive memory device with a high value 812-1 has one end to which a second dummy bit line BL_d2 may be coupled. The twenty third transistor N28 has a gate to which the word line WL may be coupled, and a drain and a source to which the other end of the resistive memory device with a high value 812-1 and a second dummy bit line bar BLb_d2 are respectively coupled.

The reference voltage generation unit 820 may be coupled to the first and second dummy resistive memory cells 811 and 812 through the first and second dummy bit lines BL_d1 and BL_d2 and the first and second dummy bit line bars BLb_d1 and BLb_d2, and is may be configured to generate the reference voltage Vref which has a voltage level corresponding to the average value of the data value of the low level and the data value of the high level.

The reference voltage generation unit 820 may include twenty fourth to thirty first transistors P16, P17 and N29 to N34. The twenty fourth transistor P16 has a source which is applied with the power supply voltage VDD, and a gate and a drain which are coupled with each other. The twenty fifth transistor P17 has a gate to which the gate of the twenty fourth transistor P16 may be coupled, and a source which is applied with the power supply voltage VDD. The twenty sixth transistor N29 has a gate which is applied with the clamp voltage VCLAMP, and a drain to which a node coupled with the gate and the drain of the twenty fourth transistor P16 may be coupled. The twenty seventh transistor N30 has a gate which is applied with the clamp voltage VCLAMP, and a drain to which the drain of the twenty fifth transistor P17 may be coupled. The twenty eighth transistor N31 has a gate which is inputted with the first sense amplifier enable signal SAE1, a drain to which the source of the twenty sixth transistor N29 may be coupled, and a source to which the first dummy bit line BL_d1 may be coupled. The twenty ninth transistor N32 has a gate which is inputted with the first sense amplifier enable signal SAE1, a source to which the ground terminal VSS may be coupled, and a drain to which the first dummy bit line bar BLb_d1 may be coupled. The thirtieth transistor N33 has a gate which is inputted with the first sense amplifier enable signal SAE1, a is drain to which the source of the twenty seventh transistor N30 may be coupled, and a source to which the second dummy bit line BL_d2 may be coupled. The thirty first transistor N34 has a gate which is inputted with the first sense amplifier enable signal SAE1, a source to which the ground terminal VSS may be coupled, and a drain to which the second dummy bit line bar BLb_d2 may be coupled. The source of the twenty sixth transistor N29 and the source of the twenty seventh transistor N30 are coupled with each other. The bias voltage Vpbias is generated from the node to which the gate and the drain of the twenty fourth transistor P16 are coupled, and the reference voltage Vref is generated from a node to which the twenty fifth transistor P17 and the twenty seventh transistor N30 are coupled.

The reference voltage generation unit 820 configured in this way may operate as follows.

When the word line WL is enabled, the first dummy bit line BL_d1, the resistive memory device with a low value 811-1 and the first dummy bit line bar BLb_d1 are coupled.

Also, when the word line WL is enabled, the second dummy bit line BL_d2, the resistive memory device with a high value 812-1 and the second dummy bit line bar BLb_d2 are coupled.

In the state in which the word line WL is enabled, if the first sense amplifier enable signal SAE1 is enabled, a path of current flowing through the first dummy bit line BL_d1, the resistive memory device with a low value 811-1 and the first dummy bit line bar BLb_d1 to the ground terminal VSS is defined. The current flowing through the first dummy bit line BL_d1 is referred to as first current I_L.

In the state in which the word line WL is enabled, if the first sense amplifier enable signal SAE1 is enabled, a path of current flowing through the second dummy bit line BL_d2, the resistive memory device with a high value 812-1 and the second dummy bit line bar BLb_d2 to the ground terminal VSS is defined. The current flowing through the second dummy bit line BL_d2 is referred to as second current I_H.

If the first sense amplifier enable signal SAE1 is enabled, the drain of the twenty eighth transistor N31 and the drain of the thirtieth transistor N33 are coupled with each other, and the twenty eighth transistor N31 flows the first current I_L and the thirtieth transistor N33 flows the second current I_H. Therefore, current I_L+I_H obtained by summing the first and second current I_L and I_H flows through a node to which the twenty eighth transistor N31 and the thirtieth transistor N33 are coupled. Because the twenty sixth and twenty seventh transistors N29 and N30, which supply current to the node coupled with the drains of the twenty eighth and thirtieth transistors N31 and N33, are inputted with the same signal VCLAMP through the gates thereof and are coupled to the same node through the sources thereof, the twenty sixth and twenty seventh transistors N29 and N30 flow the same amount of current. Since the sum of amounts of current which flows through the twenty sixth and twenty seventh transistors N29 and N30 is I_L+I_H, each of the twenty sixth and twenty seventh transistors N29 and N30 flows current of (I_L+I_H)/2. Thus, the reference voltage Vref outputted from the drain of the twenty seventh transistor N30 has a voltage level corresponding to the average value of the current flowing through the resistive memory device with a low value 811-1 and the current flowing through the resistive memory device with a high value 812-1.

Operations of the semiconductor memory apparatus in accordance with the embodiments of the present invention, configured as mentioned above, will be described below with reference to FIGS. 2 to 4.

If the word line WL is enabled in a read operation, the bit line BL and the bit line bar BLb are coupled to the resistive memory device 110.

When the bit line isolation signal BIS is disabled, the bit line BL and the bit line bar BLb are coupled to the control unit 400.

When the first sense amplifier enable signal SAE1 is enabled, a preset voltage is applied to the bit line BL. Meanwhile, when the first sense amplifier enable signal SAE1 is enabled, the bit line bar BLb may be coupled to the ground terminal VSS. Accordingly, when the first sense amplifier enable signal SAE1 is enabled, a current path in which the bit line BL applied with the preset voltage, the resistive memory device 110, the bit line bar BLb and the ground terminal VSS are coupled is defined.

When the second sense amplifier enable signal SAE2 is enabled after the first sense amplifier enable signal SAE1 is enabled, the first node Node_A which may be coupled to the data output sense amplifier 500 may be coupled to the bit line BL. Also, when the second sense amplifier enable signal SAE2 is enabled, the reference voltage Vref is applied to the second node Node_B which may be coupled to the data output sense amplifier 500.

The data output sense amplifier 500 senses and amplifies the levels of the voltage corresponding to the amount of current flowing through the first node Node_A, the bit line BL, the resistive memory device 110 and the bit line bar BLb to the ground terminal VSS and the reference voltage Vref applied through the second node Node_B. At this time, the resistive memory device 110 has a different resistance value in the case where data to be stored is a high level or a low level. Further, as described above, the reference voltage Vref has a voltage level corresponding to the average value of the amounts of current flowing through the resistive memory device 110 in the case where the resistive memory device 110 has a high level and a low level. Thus, in the case where the resistive memory device 110 has a resistance value corresponding to the high level or the low level, the bit line BL has a voltage level according to the level of the data of the resistive memory device 110, and the data output sense amplifier 500 compares the voltage level of the bit line BL with the reference voltage Vref and raises the voltage level of one of the first and second nodes Node_A and Node_B.

After the voltage levels of the first and second nodes Node_A and Node_B are amplified through the data output sense amplifier 500, if the column select signal YI is enabled, the first and second nodes Node_A and Node_B, the data line DATA_L and the data line bar DATA_Lb are coupled. Accordingly, the data sensed and amplified by the data output sense amplifier 500 are outputted through the data line DATA_L and the data line bar DATA_Lb.

If the column select signal YI is enabled in the write operation, the first and second nodes Node_A and Node_B are coupled to the data line DATA_L and the data line bar DATA_Lb. Thus, the voltage levels of the data line DATA_L and the data line bar DATA_Lb are transferred to the first and second nodes Node_A and Node_B. That is to say, if the column select signal YI is enabled in the write operation, data are transferred to the first and second nodes Node_A and Node_B through the data line DATA_L and the data line bar DATA_Lb.

If the write enable signal WE is enabled, the data input unit 700 generates the voltage levels of the bit line BL and the bit line bar BLb according to the voltage levels of the first and second nodes Node_A and Node_B. For example, in the case where the voltage level of the first node Node_A is higher between the voltage levels of the first and second nodes Node_A and Node_B, the data input unit 700 raises the voltage level of the bit line BL and lowers the voltage level of the bit line bar BLb. Also, in the case where the voltage level of the second node Node_B is higher between the voltage levels of the first and second nodes Node_A and Node_B, the data input unit 700 lowers the voltage level of the bit line BL and raises the voltage level of the bit line bar BLb.

In the state in which the word line WL is enabled, if the voltage levels of the bit line BL and the bit line bar BLb change, the resistance value of the resistive memory device 110 changes as well. For instance, if the path of current flowing from the bit line BL through the resistive memory device 110 to the bit line bar BLb is defined as the voltage level of the bit line BL is higher than that of the bit line bar BLb, the resistive memory device 110 has a resistance value corresponding to a high level. Also, if the path of current flowing from the bit line bar BLb through the resistive memory device 110 to the bit line BL is defined as the voltage level of the bit line bar BLb is higher than that of the bit line BL, the resistive memory device 110 has a resistance value corresponding to a low level. The resistance values corresponding to the high level and the low level of the resistive memory device 110 are different from each other.

Figure 1:
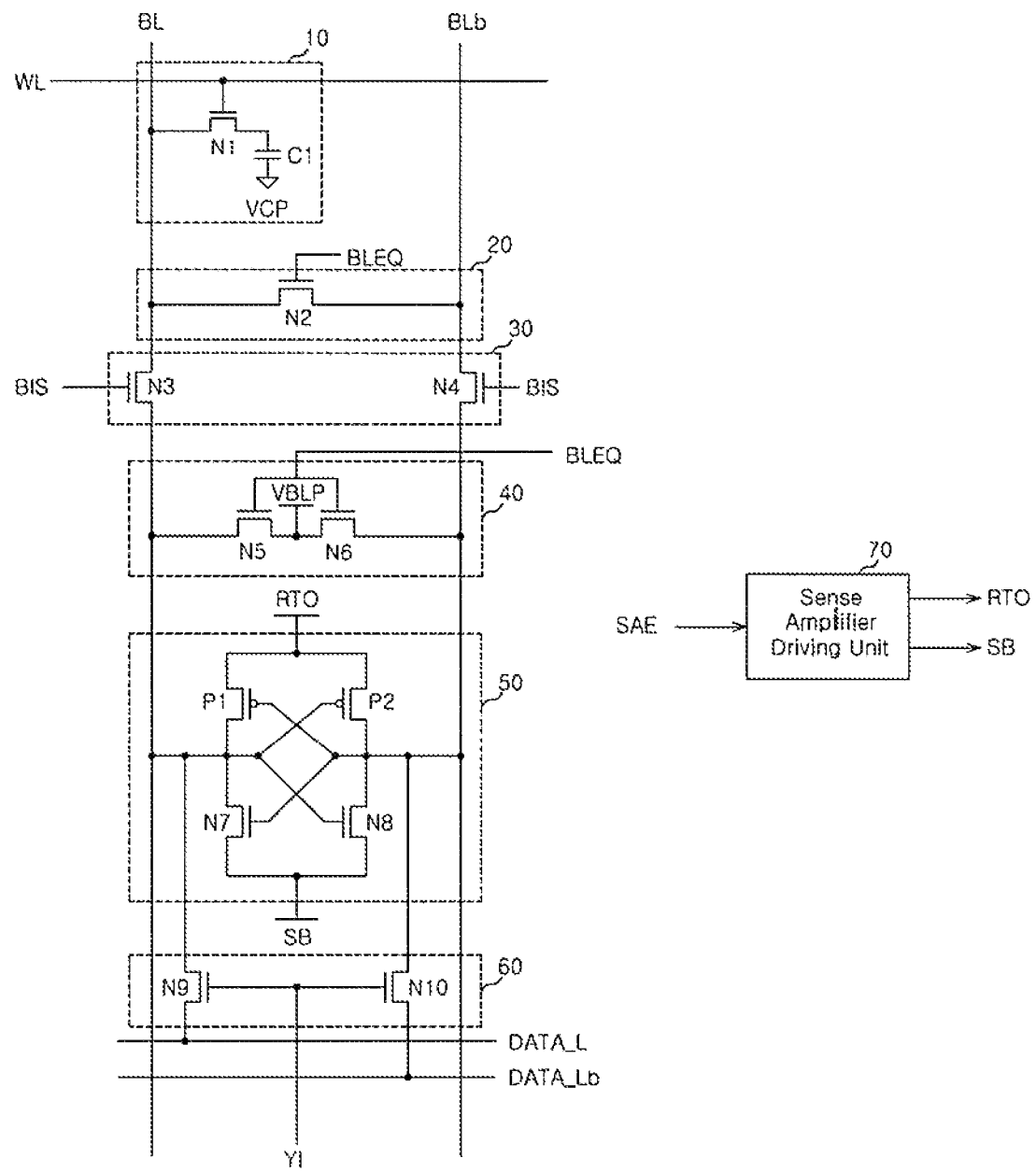
FIG. 1 is a configuration diagram of a conventional semiconductor memory apparatus.

As is apparent from the above descriptions, the semiconductor memory apparatus in accordance with the embodiments of the present invention may drive a resistive memory cell in the circumstances of a semiconductor memory apparatus having a memory cell constituted by a capacitor as shown in FIG. 1.

While various embodiments have been described above, it will be understood to those skilled in the art that the embodiments described are by way of example only. Accordingly, the semiconductor memory apparatus described herein should not be limited based on the described embodiments. Rather, the semiconductor memory apparatus described herein should only be limited in light of the claims that follow when taken in conjunction with the above description and accompanying drawings.

What is claimed is:

1. A semiconductor memory apparatus comprising:
   a resistive memory cell coupled between a bit line and a bit line bar;
   a control unit configured to couple the bit line to a first node in response to a first sense amplifier enable signal and a second sense amplifier enable signal, and apply a reference voltage to a second node in response to the second sense amplifier enable signal;
   a data output sense amplifier configured to sense and amplify a voltage of the first node and a voltage of the second node;
   a data transfer unit configured to couple the first and second nodes to a data line and a data line bar in response to a column select signal; and
   a data input unit configured to drive the bit line and the bit line bar according to voltage levels of the first and second nodes in response to a write enable signal.

2. The semiconductor memory apparatus according to claim 1, wherein the second sense amplifier enable signal is acquired by delaying the first sense amplifier enable signal.

3. The semiconductor memory apparatus according to claim 2, wherein the control unit applies a specified voltage level to the bit line and couples the bit line bar to a ground terminal when the first sense amplifier enable signal is enabled, and couples the first and second nodes to the data output sense amplifier when the second sense amplifier enable signal is enabled.

4. The semiconductor memory apparatus according to claim 1, wherein the data transfer unit couples the first node to the data line and couples the second node to the data line bar when the column select signal is enabled.

5. The semiconductor memory apparatus according to claim 1, wherein the data input unit lowers a voltage level of the bit line and raises a voltage level of the bit line bar when the voltage level of the first node is higher than the voltage level of the second node in the case where the write enable signal is enabled, and raises a voltage level of the bit line and lowers a voltage level of the bit line bar when the voltage level of the first node is lower than the voltage level of the second node in the case where the write enable signal is enabled.

6. The semiconductor memory apparatus according to claim 1, further comprising:
a first dummy resistive memory cell having a data value of a low level;
a second dummy resistive memory cell having a data value of a high level; and
a reference voltage generation unit coupled to the first and second dummy resistive memory cells and configured to generate the reference voltage which has a voltage level corresponding to an average value of the data value of the low level and the data value of the high level.

7. A semiconductor memory apparatus comprising:
a control unit configured to couple a bit line to a data output sense amplifier in a read operation;
the data output sense amplifier configured to sense and amplify a voltage level of the bit line when the data output sense amplifier is coupled to the bit line;
a data transfer unit configured to receive a column select signal and couple a data line to the data output sense amplifier and to a data input unit in response to the column select signal in a read or write operation; and
the data input unit comprising a transfer transistor configured to transfer data from the data transfer unit onto the bit line by transferring a voltage level corresponding to a voltage level of the data line to the bit line in response to the voltage level on the data line.

8. The semiconductor memory apparatus according to claim 7, wherein the control unit couples the bit line to the data output sense amplifier when a sense amplifier enable signal is enabled and decouples the bit line and the data output sense amplifier when the sense amplifier enable signal is disabled.

9. The semiconductor memory apparatus according to claim 7, wherein the data transfer unit couples the data line to the data output sense amplifier and the data input unit when a column select signal is enabled.

10. A semiconductor memory apparatus comprising:
a resistive memory cell coupled between a bit line and a bit line bar;
a control unit configured to couple the bit line to a data output sense amplifier and couple the bit line bar to a ground terminal in response to a sense amplifier enable signal;
the data output sense amplifier configured to compare a voltage level of the bit line with a level of a reference voltage and amplify a difference thereof, when the data output sense amplifier is coupled to the bit line;
a data input unit configured to generate voltage levels of the bit line and the bit line bar according to voltage levels of a data line and a data line bar in response to a write enable signal, when the data input unit is coupled to the data line and the data line bar; and
a data transfer unit configured to couple or decouple the data line to and from the data output sense amplifier and the data input unit in response to a column select signal.

11. The semiconductor memory apparatus according to claim 10, wherein the control unit couples the bit line to the data output sense amplifier and couples the bit line bar to the ground terminal when the sense amplifier enable signal is enabled, and decouples the bit line from the data output sense amplifier and decouples the bit line bar from the ground terminal when the sense amplifier enable signal is disabled.

12. The semiconductor memory apparatus according to claim 10, wherein the data input unit raises the voltage level of any one of the bit line and the bit line bar and lowers the voltage level of the other of the bit line and the bit line bar, in response to the voltage levels of the data line and the data line bar.

13. The semiconductor memory apparatus according to claim 10, wherein the reference voltage has a voltage level corresponding to an average value when the resistive memory cell has data of a high level and a low level.

14. A method of operating a semiconductor memory apparatus, comprising:
coupling a resistive memory cell between a bit line and a bit line bar;
coupling the bit line to a first node in response to a first sense amplifier enable signal and a second sense amplifier enable signal, and applying a reference voltage to a second node in response to the second sense amplifier enable signal;
sensing and amplifying a voltage of the first node and a voltage of the second node;
coupling the first and second nodes to a data line and a data line bar in response to a column select signal; and
driving the bit line and the bit line bar according to voltage level of the first and second nodes in response to a write enable signal.

15. The method of claim 14, wherein the second sense amplifier enable signal is acquired by delaying the first sense amplifier enable signal.

16. The method of claim 15, further comprising:
applying a specified voltage level to the bit line and coupling the bit line bar to a ground terminal when the first sense amplifier enable signal is enabled; and
coupling the first and second nodes to the data output sense amplifier when the second sense amplifier enable signal is enabled.

17. The method of claim 14, further comprising:
coupling the first node to the data line and coupling the second node to the data line bar when the column select signal is enabled.

18. The method of claim 14, further comprising:
lowering a voltage level of the bit line and raising a voltage level of the bit line bar when the voltage level of the first node is higher than the voltage level of the second node in the case where the write enable signal is enabled; and
raising a voltage level of the bit line and lowering a voltage level of the bit line bar when the voltage level of the first node is lower than the voltage level of the second node in the case where the write enable signal is enabled.

19. The method of claim 14, further comprising:
providing a first dummy resistive memory cell having a data value of a low level;
providing a second dummy resistive memory cell having a data value of a high level; and
coupling to the first and second dummy resistive memory cells through a reference voltage generation unit and generating the reference voltage which has a voltage level corresponding to an average value of the data value of the low level and the data value of the high level.

\* \* \* \* \*